US009360775B2

(12) United States Patent
Feldmann et al.

(10) Patent No.: US 9,360,775 B2
(45) Date of Patent: Jun. 7, 2016

(54) METHOD OF MANUFACTURING A PROJECTION OBJECTIVE AND PROJECTION OBJECTIVE

(75) Inventors: Heiko Feldmann, Aalen (DE); Toralf Gruner, Aalen-Hofen (DE); Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1160 days.

(21) Appl. No.: 13/364,565

(22) Filed: Feb. 2, 2012

(65) Prior Publication Data

US 2012/0134016 A1      May 31, 2012

Related U.S. Application Data

(60) Division of application No. 12/413,981, filed on Mar. 30, 2009, now Pat. No. 8,310,752, which is a continuation of application No. PCT/EP2007/010244, filed on Nov. 26, 2007.

(60) Provisional application No. 60/861,713, filed on Nov. 30, 2006.

(30) Foreign Application Priority Data

Nov. 30, 2006   (EP) .................................... 06024789

(51) Int. Cl.
*G03F 7/20* (2006.01)

(52) U.S. Cl.
CPC ............ *G03F 7/70891* (2013.01); *G03F 7/705* (2013.01); *G03F 7/70225* (2013.01); *G03F 7/70275* (2013.01); *G03F 7/70983* (2013.01)

(58) Field of Classification Search
CPC . G03F 7/70891; G03F 7/70275; G03F 7/705; G03F 7/70225; G03F 7/70983
See application file for complete search history.

(56) References Cited

U.S. PATENT DOCUMENTS

| 5,067,067 | A | 11/1991 | Estelle et al. |
| 7,130,129 | B2 | 10/2006 | Schultz et al. |
| 8,310,752 | B2 | 11/2012 | Feldmann et al. |
| 2002/0163737 | A1 | 11/2002 | Kohler et al. |
| 2003/0063268 | A1* | 4/2003 | Kneer .................. G02B 13/143 355/67 |

(Continued)

FOREIGN PATENT DOCUMENTS

| DE | 10 2004 006262 | 9/2005 |
| EP | 0 668 541 | 8/1995 |

(Continued)

OTHER PUBLICATIONS

Korean Office Action, with translation thereof, for corresponding KR Appl No. 2009-7010491, dated Dec. 31, 2013.

(Continued)

*Primary Examiner* — Mohammad Ali
*Assistant Examiner* — Nathan L Laughlin

(57) ABSTRACT

The disclosure relates to a method of manufacturing a projection objective, and a projection objective, such as a projection objective configured to be used in a microlithographic process. The method can include defining an initial design for the projection objective and optimizing the design using a merit function. The method can be used in the manufacturing of projection objectives which may be used in a microlithographic process of manufacturing miniaturized devices.

25 Claims, 9 Drawing Sheets

(56) References Cited

U.S. PATENT DOCUMENTS

| | | | |
|---|---|---|---|
| 2004/0036961 A1* | 2/2004 | McGuire, Jr. | G02B 17/08 359/344 |
| 2005/0230599 A1 | 10/2005 | Orino | |
| 2006/0170897 A1 | 8/2006 | Kneer et al. | |
| 2006/0198018 A1 | 9/2006 | Shafer et al. | |
| 2007/0013882 A1* | 1/2007 | Dodoc | G03B 21/00 353/122 |
| 2009/0207487 A1 | 8/2009 | Feldmann et al. | |

FOREIGN PATENT DOCUMENTS

| | | |
|---|---|---|
| JP | H03-44609 | 2/1991 |
| JP | H11223769 A2 | 8/1999 |
| JP | 2005-003982 | 1/2005 |
| JP | 2005-301054 A2 | 10/2005 |
| JP | 2006-220914 | 8/2006 |
| JP | 5559543 | 6/2014 |
| KR | 2003-0021127 | 3/2003 |
| KR | 10-0524662 | 1/2006 |
| WO | WO 2004/019128 | 3/2004 |
| WO | WO 2005/111689 | 11/2005 |

OTHER PUBLICATIONS

Japanese Office Action with translation thereof, for corresponding JP Application 2014-117797 dated Mar. 31, 2015.

Japanese Office Action, with translation thereof, for corresponding JP Appl No. 2009-538628, dated Aug. 29, 2013.

Japanese Office Action, with translation thereof, for JP Appl No. 2014-117797, dated Nov. 5, 2015.

* cited by examiner

METHOD OF MANUFACTURING A PROJECTION OBJECTIVE AND PROJECTION OBJECTIVE

CROSS-REFERENCE TO RELATED APPLICATIONS

This application is a divisional of, and claims benefit under 35 USC 120 to, U.S. application Ser. No. 12/413,981, filed Mar. 30, 2009, now U.S. Pat. No. 8,310,752, which is a continuation of, and claims benefit under 35 USC 120 to, International Application No. PCT/EP2007/010244, filed Nov. 26, 2007, which claims benefit of U.S. Ser. No. 60/861,713, filed Nov. 30, 2006 and European Application No. 06024789.7, filed Nov. 30, 2006. The entire contents of International Application No. PCT/EP2007/010244 and U.S. application Ser. No. 12/413,981 are hereby incorporated by reference.

FIELD

The disclosure relates to a method of manufacturing a projection objective, and a projection objective, such as a projection objective configured to be used in a microlithographic process. The method can include defining an initial design for the projection objective and optimizing the design using a merit function. The method can be used in the manufacturing of projection objectives which may be used in a microlithographic process of manufacturing miniaturized devices.

BACKGROUND

Microlithographic processes are commonly used in the manufacture of miniaturized devices, such as integrated circuits, liquid crystal elements, micro-patterned structures and micro-mechanical components. In such processes, a projection objective projects patterns of a patterning structure (usually a photo mask (mask, reticle)) onto a substrate (usually a semiconductor wafer). The substrate is coated with a photo-sensitive layer (resist) which is exposed with an image of the patterning structure using projection radiation.

Generating a new design of a projection objective can be a complicated task involving an optimization of structural parameters and quality parameters of the projection objective. The structural parameters include refractive indices of materials of which the lenses are formed, surface shape parameters of lenses and mirrors (if applicable), distances between first and second surfaces of each lens, distances between surfaces of different optical elements, a distance between the object plane of the projection objective and an entry surface of the object-side front element of the projection objective, a distance between an exit surface of an image-side front element of the projection objective and the image plane, refractive indices of media disposed between adjacent optical elements, between the object plane and the object-side front element and between the image plane and the image-side front element. Quality parameters include parameters describing the optical performance of the projection objective e.g. in terms of selected aberrations, image-side numerical aperture, magnification of the projection objective and the like.

The optimization of a design to conform to a desired specification of the optical performance and other quality features of the projection objective typically involves computational methods such as ray tracing to optimize the parameters of the projection objective while observing certain boundary conditions. CODE V, a lens analysis and design program sold by Optical Research Associates, Inc., is a commonly used software tool employed for that purpose. The optimization includes minimizing or maximizing a suitably chosen merit function depending on the parameters of the design. Typically, the merit function construction is done by utilizing several merit function components, which may represent optical aspects, manufacturability aspects and other aspects describing the optimization goal of the specific design.

SUMMARY

In some embodiments, the disclosure provides a method of manufacturing projection objectives that allows to manufacture complex projection objectives for microlithography in a cost effective way while maintaining high standards with respect to optical performance.

In certain embodiments, the disclosure provides a method of manufacturing projection objectives that allows to manufacture projection objectives for microlithography having an optical performance which is relatively insensitive with respect to surface imperfections present on optical surfaces within the projection objective.

In some embodiments, the disclosure provides a method of manufacturing projection objectives having a low level of field variation of intensity.

In certain embodiments, the disclosure provides a projection objective which is relatively insensitive towards surface imperfections caused by contamination and other effects on optical surfaces within the projection objective.

In some embodiments, the disclosure provides a method of manufacturing a projection objective. The method can include defining an initial design for a projection objective and optimizing the design using a merit function. The method can further include defining a plurality of merit function components, each of which can reflect a particular quality parameter. One of the merit function components can define a maximum desired irradiance involving a normalized effective irradiance value representing an effective irradiance normalized to an effective irradiance in an image surface of the projection objective does not exceed a predefined irradiance threshold value on each optical surface of the projection objective except for a last optical surface directly adjacent to an image surface of the projection objective. The method can also include computing a numerical value for each of the merit function components based on a corresponding feature of a preliminary design of the projection objective, and computing from the merit function components an overall merit function expressible in numerical terms that reflect quality parameters. In addition, the method can include successively varying at least one structural parameter of the projection objective and recomputing a resulting overall merit function value with each successive variation until the resulting overall merit function reaches a predetermined acceptable value. Further, the method can include obtaining the structural parameters of the optimized projection objective having the predetermined acceptable value for the resulting overall merit function. The method can also include implementing the parameters to make the projection objective.

The term "irradiance" describes the power of electromagnetic radiation incident on the surface. The term "effective irradiance" as used herein describes the contribution to an overall irradiance incident on an optical surface, which contribution originates from radiation emerging from one single object field point. The effective irradiance is alternatively denoted as "pin-hole irradiance" in this application.

Where large values of effective irradiance are avoided on optical surfaces, the optical performance of a projection objective may be made relatively insensitive with respect to surface imperfections present on optical surfaces within the projection objective.

In many cases, the "last optical surface", i.e. the optical surface of the projection objective closest to the image surface, is subject to particular conditions involving the last optical surface to be excluded from the optimization process. The spatial distribution of points of incidence of radiation rays across the last optical surface is largely influenced by the concept of the projection process involved (dry projection or immersion projection) and on the geometrical conditions in the image side working space (space between the last optical surface and the image surface, where the substrate surface is to be placed.). For example, it may be useful to provide a narrow gap (typically one or more millimeters wide) between last optical surface and image surface to introduce an immersion liquid for immersion exposure. In view of the inflow and outflow of immersion medium in the image space it is often desired to have an essentially planar last optical surface. Under these conditions, the intensity load of the last optical surface (represented e.g. by the effective irradiance) is basically determined by the image-side working distance, the size of the effective image field, the refractive index of the medium after the last optical element, and the image side numerical aperture NA. Therefore, the structural parameters describing position and surface shape of the last optical surface are no free parameters and should be excluded from the optimization procedure.

Various conditions may cause or contribute to local maxima of effective irradiance on optical surfaces. For example, large effective irradiance values may occur where an optical surface lies within a caustic region. In some embodiments, those conditions are systematically avoided by calculating a position and an extent of potential caustic regions within the projection objective; and by optimizing the structural parameters of the projection objective such that no optical surface is positioned inside a caustic region.

Alternatively, or in addition, optical surfaces may be relatively important where the size of real sub-apertures of ray bundles becomes relatively importantly small. Therefore, in certain embodiments, the method includes: defining a number of representative field points; calculating ray bundles originating from the field points and intersection zones of the ray bundles with optical surfaces, where an intersection zone of a ray bundle with an optical surface defines a real sub-aperture having a sub-aperture size defined by the area of the intersection zone; defining a sub-aperture size threshold value; and optimizing the structural parameters of the projection objective such that the real sub-aperture size for selected field points does not fall below the sub-aperture size threshold value for all optical surfaces of the projection objective except for a last optical surface directly adjacent to an image surface of the projection objective.

Embodiments may include routines considering more than one cause of relatively importantly high effective irradiance concentrations. For example, one merit function component may define a desired maximum irradiance as described above, and another merit function component may define a minimum real sub-aperture property such that a resulting optical design will automatically have only optical surfaces where the size of real sub-apertures on all optical surfaces (except for last optical surface) lies above a predefined real sub-aperture size threshold value.

The method may be applied in the design of various types of optical systems, such as projection objectives used for microlithography having a relatively high image-side numerical aperture, as frequently found in projection objectives for immersion lithography, where NA>1 may be obtained. A detailed analysis of a large number of prior art projection objectives has shown that small effective and/or real sub-apertures and/or caustic conditions may occur particularly in catadioptric projection objective having at least one concave mirror and at least one intermediate image as well as at least one planar deflecting mirror to separate the beam bundle running towards the concave mirror from a beam bundle reflected from the concave mirror. Projection objectives of this type may be designed such that they have no optical surface (except for the last optical surface adjacent to the image surface) where caustic conditions occur and/or where relatively importantly small effective and/or real sub-apertures occur.

In some embodiments, a projection objective includes a plurality of optical elements arranged to image an off-axis object field arranged in an object surface onto an off-axis image field arranged in an image surface of the projection objective. The optical elements form: a first refractive objective part generating a first intermediate image from radiation coming from the object surface and including a first pupil surface; a second objective part including at least one concave mirror imaging the first intermediate image into a second intermediate image and including a second pupil surface optically conjugated to the first pupil surface; and a third refractive objective part imaging the second intermediate image onto the image surface and including a third pupil surface optically conjugated to the first and second pupil surface.

Embodiments may have exactly two intermediate images.

The second objective part may have exactly one concave mirror and the projection objective may have a first folding mirror for deflecting radiation coming from the object surface in the direction of the concave mirror, and a second folding mirror for deflecting radiation coming from the concave mirror in the direction of the image surface. The deflecting mirrors may both be planar. The projection objective may be designed for immersion lithography at NA>1.

DETAILED DESCRIPTION

As an introduction to some of the embodiments of the disclosure consider a high aperture catadioptric projection objective adapted for immersion lithography NA>1. In many cases such designs exhibit rather small real sub-apertures on optical surfaces. As used herein, the term "real sub-aperture" refers to a "footprint" (intersection zone) of a ray bundle originating from a specific object point (i.e. field point in the object surface) on an optical surface. Small real sub-apertures may occur particularly in catadioptric projection objectives having at least one concave mirror and at least one intermediate image as well as at least one planar deflecting mirror to separate a beam bundle running towards the concave mirror from a beam bundle reflected from the concave mirror.

Figure 1A:
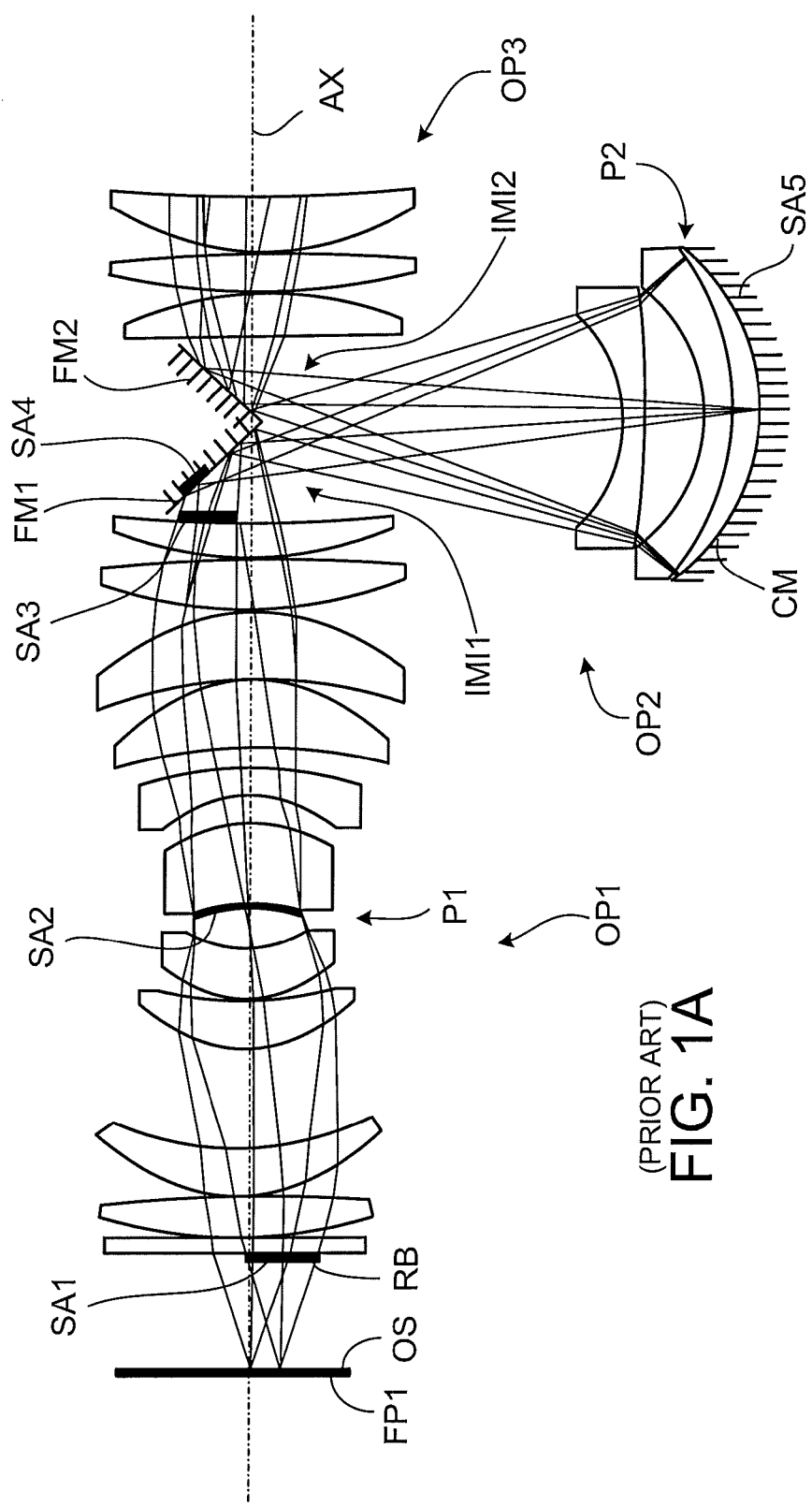
FIGS. 1A and 1B show prior art catadioptric projection objectives having exactly two intermediate images and a single concave mirror.
Figure 2:
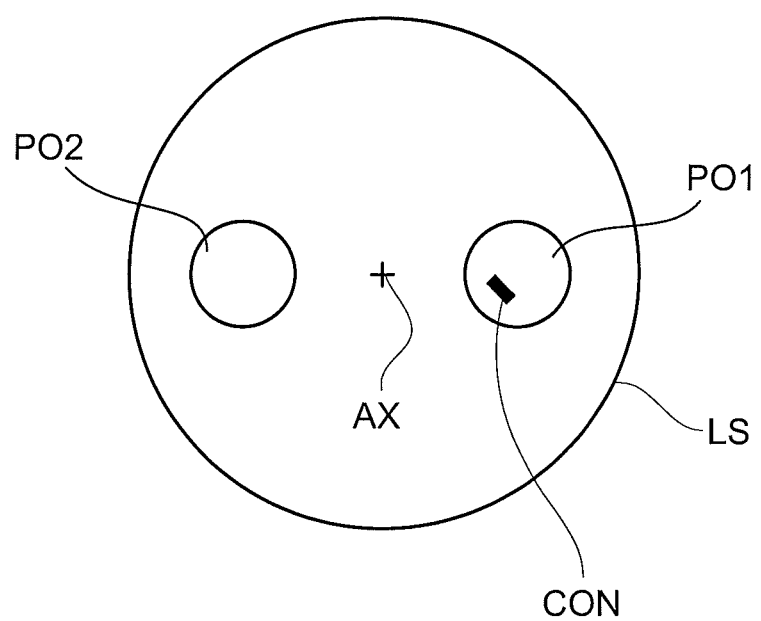
FIG. 2 shows a schematic drawing of an axial view of a lens surface positioned at a pupil surface and illuminated with dipole illumination.

For illustration purposes, FIG. 1A shows a detail of a prior art catadioptric projection objective taken from FIG. 2 of WO 2004/019128 A2. The projection objective includes the first refractive objective part OP1 to image an object field from the planar object surface OS into a first intermediate image IMI1, a second, catadioptric objective part OP2 including a concave mirror CM for imaging the first intermediate image IMI1 into a second intermediate image IM12, and a third, refractive objective part OP3 (only partially shown) to image the second intermediate image IMI2 into the planar image surface, which is parallel to the object surface OS. A first planar folding mirror FM1 deflects radiation coming from the object surface towards the concave mirror CM. A second planar folding mirror FM2 at right angles to first folding mirror deflects radiation coming from the concave mirror towards the image surface.

A ray bundle RB originating from an off-axis field point FP1 of an effective object field positioned entirely outside the optical axis AX intersects the optical surfaces in intersection zones of varying size depending on the position of the optical surface within the optical system. Those intersection zones are denoted "real sub-apertures" in this application. Some representative intersection zones are emphasized in bold lines in FIG. 1. The first real sub-aperture SA1 on the entry side of a plane-parallel plate directly following the object surface is rather close to a field surface (object surface) and relatively small. The size of a second real sub-aperture SA2 close to a first pupil surface P1 on a concave entry side of a meniscus lens essentially corresponds to the size of the pupil at that position and is relatively large. All real sub-apertures substantially overlap at the pupil surface. Real sub-apertures become increasingly smaller as the optical surfaces are positioned closer to the first intermediate image IMI1, as can be seen for real sub-aperture SA3 on the concave exit side of positive meniscus lens immediately upstream of the first folding mirror FM1, and by real sub-aperture SA4 formed on the first folding mirror FM1 immediately upstream of the first intermediate image. In contrast, a fifth real sub-aperture SA5 on a convex surface of a negative meniscus lens immediately in front of the concave mirror CM has a large size essentially corresponding to the size of the second pupil P2 where the concave mirror CM is positioned.

An off-axis object field and image field is used in those designs to obtain an image free of vignetting and pupil obscuration. When an off-axis field is used, the efforts involved for correcting imaging aberrations increase with increasing distance between the off-axis object field and the optical axis such that the size of the "design object field" increases. The "design object field" includes all field points of the object surface which can be projected by the projection objective with an imaging fidelity sufficient for the intended lithographic process. All imaging aberrations are corrected sufficiently for the intended projection purpose inside the design object field, whereas at least one of the aberrations is higher than a desired threshold value for field points outside of the design object field. In order to facilitate correction, it may therefore be desirable to keep the size of the design object field small, which, in turn, involves to minimize the offset between the optical axis and the off-axis object field. Efforts to minimize this offset often lead to designs having mirror surfaces and/or lens surfaces relatively close to a field surface, whereby the corresponding real sub-apertures present on those optical surfaces close to field surfaces become small. For example, the real sub-apertures SA3 and SA4 on lens and mirror surfaces immediately upstream of first intermediate image IMI1 are relatively small.

Small real sub-apertures on optical surfaces generally involve severe desired properties with respect to cleanliness of the manufacturing process and the resulting optical surfaces, which should be essentially free of significant surface imperfections. As the energy emitted from a selected field point is concentrated on a relatively small area in a region of a small real sub-aperture, an imperfection present in that region of small real sub-aperture would block some of the light intensity present in the ray bundle, thereby creating light loss. Where the corresponding real sub-aperture is small, a surface imperfection of a given size causes a larger light loss effect than in an area with a larger real sub-aperture simply because the ratio between the area of the imperfection causing the perturbation and the area of the real sub-aperture (footprint area) becomes more unfavourable. Localized light loss caused by imperfections may cause uniformity errors with direct problems regarding the critical dimensions of structures manufactured with a projection objective. Specifically, undesirable variations of the critical dimension (CD variation) may be caused in connection with the sensitivity level of the light-sensitive coating (photoresist) on a substrate.

Further, localized light loss may also cause telecentricity errors resulting from a shift of an energetic centroid of the pupil generally in direction of the undisturbed areas. As an illustration, FIG. 2 shows schematically an axial view of lens surface LS positioned at a circular pupil surface in a projection objective. The projection exposure machine is operated with dipole illumination to improve, for example, depth of focus and/or contrast when printing densely packed unidirectional lines. The corresponding intensity distribution of projection radiation is characterized by two "poles", a first pole PO1 and a second pole PO2, on opposite sides of the optical axis AX, where light energy is concentrated. No light intensity is on the optical axis. A surface contamination CON is present on the lens surface LS in the area of first pole PO1. As the contamination CON blocks a considerable fraction of light energy present in the first pole PO1, the energetic centroid of the pupil will be shifted towards the undisturbed second pole PO2. This decentred energetic centroid in the pupil corresponds to a propagation direction in which the intensity centroid of the image propagates in the image space where the wafer is positioned. Due to the contamination CON, the propagation direction deviates from the optical axis and is directed at a finite angle thereto. An oblique orientation of the aerial image results, which may lead to telecentricity-induced distortion for example if the position of the substrate surface varies locally due to an uneven substrate surface and/or due to positioning variations caused by the wafer stage.

The size of the real sub-apertures as mentioned above is considered as a good indicator showing which optical surfaces might be relatively important with respect to surface imperfections if it is assumed that the real sub-apertures are illuminated substantially homogeneously such that there are no or very little differences in local radiation energy inflow between different locations within a real sub-aperture.

A substantially homogeneous distribution of irradiance within real sub-apertures may be a good approximation in many purely refractive optical systems. However, there may be significant variations in local irradiance within a real sub-aperture such that significant differences in local irradiance may occur within the real sub-aperture. In order to account for possible inhomogeneities regarding local irradiance within real sub-apertures it has been found useful to define an "effective sub-aperture", which allows to account for local variations of irradiance within real sub-apertures. As noted above, imperfections on optical surfaces may be relatively important where relatively large radiation energy is concentrated in the area of an imperfection. Therefore, within a real sub-aperture those regions may be particularly important where the local irradiance has a relatively large value when compared to other parts of the real sub-aperture. In order to largely avoid problems associated with local concentrations of radiation energy, it is considered useful to analyse the area of a real sub-aperture in order to identify the region (or regions) where a maximum value for the effective irradiance occurs. In a geometrical picture, the local irradiadiance may also be characterized by a specified value for a "geometrical ray density" of rays originating from a single field point in the object plane, where a maximum value for the effective irradiance occurs where a maximum value for the geometrical ray density occurs.

Now consider a system optimization which accounts for those local maxima of geometrical ray density (or effective irradiance). The tolerances for the system layout may have a certain value assuming that each real sub-aperture is homogeneously illuminated. However, the tolerances have to be tighter where local concentrations of radiation energy might occur within a real sub-aperture. This effect may be accounted for by defining an "effective sub-aperture", which corresponds to the sub-aperture which represents the location with maximum geometrical ray density (or maximum effective irradiance). Within this concept, the size of the "effective sub-aperture" equals the size of the "real sub-aperture" in systems where the real sub-aperture is homogeneously illuminated. However, if local concentrations of radiation energy occur within the real sub-aperture, this is expressed by the size of the effective sub-aperture, which then becomes smaller than the size of the real sub-aperture.

Figure 1B:
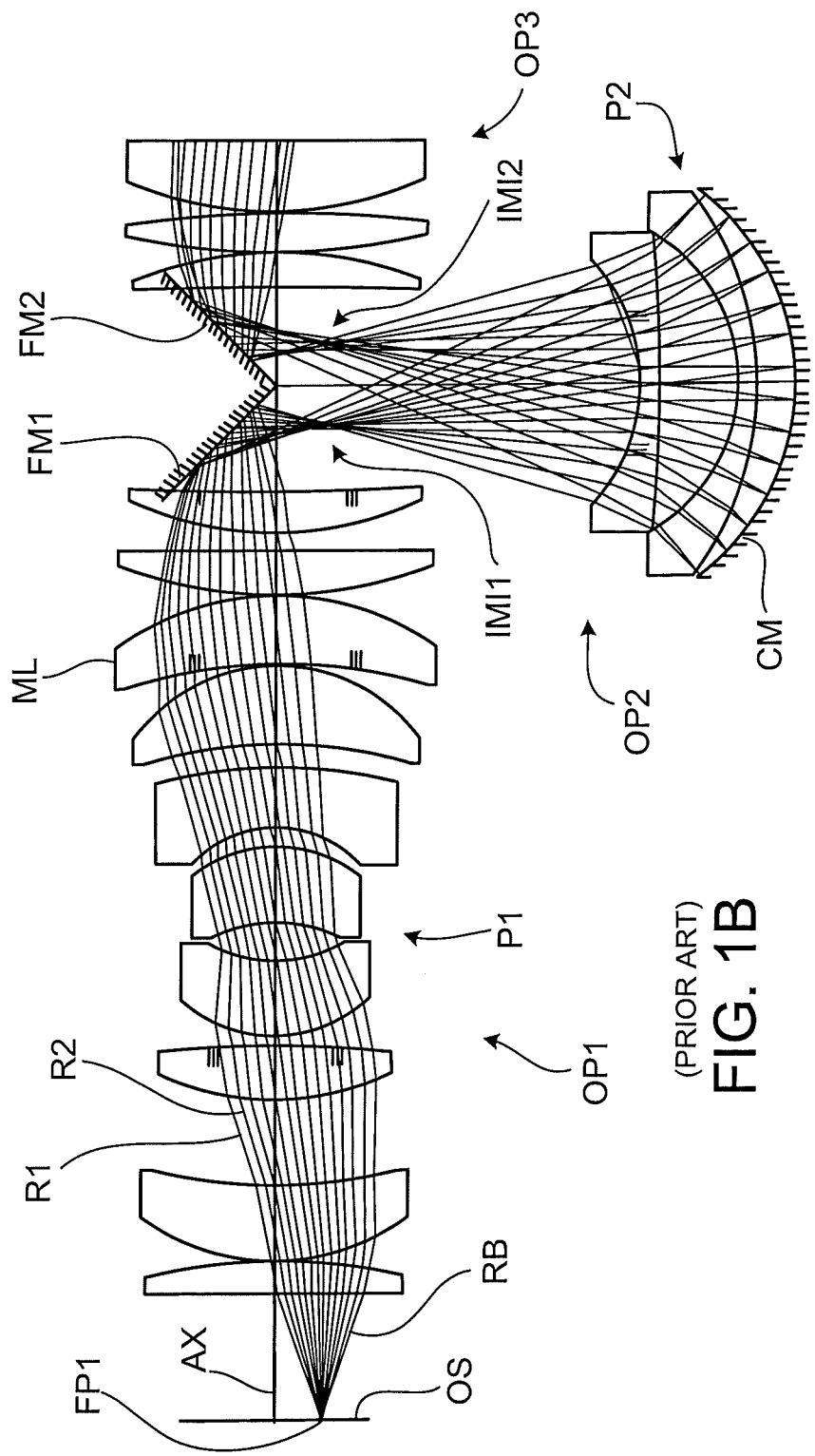

By way of illustration, FIG. 1B shows a detail of another prior art catadioptric projection objective taken from embodiment 5 of WO 2004/019128 A2. Identical or similar features are designated with identical reference numerals as in FIG. 1A. One ray bundle RB emerges from a selected field point FP1 in the object surface OS. The opening angle of the ray bundle at the object surface is determined by the object-side numerical aperture $NA_{OBJ}$. The trajectories of various selected rays including rays R1 and R2 are shown. As evident from the drawing, the geometrical ray density defined by the rays of a ray bundle RB is essentially homogeneous across the optical surfaces up to the region of the large positive meniscus lens ML upstream of first folding mirror FM1. However, as the rays approach the first folding mirror FM1, the local density of rays (i.e. the geometrical ray density) increases in the outer part of the ray bundle (farthest away from the optical axis AX) when compared to the region closer to the optical axis. With other words, the geometrical ray density becomes inhomogeneous in the region of the first folding mirror a small distance upstream of the first intermediate image IMI1. Specifically, rays R1 and R2 originating from field point FP1 at different aperture values intersect in the region close to or at the first folding mirror FM1. (Note that those intersections of single rays occur particularly in the regions of first folding mirror FM1 and second folding mirror FM2 optically close to the intermediate images IMI1, IM12, respectively.) The intersection of rays originating from a common field point at different apertures indicates the existence of a "caustic" condition. It is apparent from FIG. 1B that both the first folding mirror and the second folding mirror FM1, FM2 are positioned in regions where rays of the ray bundle RB intersect, i.e. are positioned in "caustic regions".

The geometrical ray density corresponding to a particular field point, as described above, may be considered as an expression for the contribution of a particular field point to the total irradiance on an optical surface. This contribution is denoted "effective irradiance" in the present application. In a mental experiment, consider an illuminated pinhole (representing one single field point) in the object plane of the optical system. A ray bundle originates from that field point. The "effective irradiance" corresponding to that field point is the irradiance contribution of the ray bundle originating from that field point on a selected optical surface. This contribution to the overall irradiance incident on the optical surface is a function of the position (or location) on the optical surface as well as a function of the position of the pinhole in the object surface. It is contemplated that the maximum value of all values of effective irradiance (irradiance corresponding to a single object field point) should not exceed a predetermined "irradiance threshold value".

In a caustic region, i.e. in a region where caustic conditions exist, the effective irradiance (pin-hole irradiance) may become divergent practically leading to a severe concentration of light energy on a relatively small surface area. In terms of ray propagation, a caustic condition is given on an optical surface if different rays emitted from an object point at different numerical aperture intersect on the optical surface or in the vicinity thereof. A surface imperfection on an optical surface positioned in a caustic region has an influence on rays emitted from an object point at different aperture angles, thereby potentially deteriorating imaging quality substantially more than an imperfection placed in a region outside a caustic region.

In some embodiments of a method of manufacturing a projection objective, the occurrence of caustic conditions on optical surfaces and/or of relatively importantly small effective sub-apertures on optical surfaces is systematically avoided due to a corresponding sub-routine in the software used for the computer-based optical design leading to the general layout of the optical elements of the projection objective. Where those relatively important conditions are systematically avoided, the desired properties with regard to cleanliness of the process can be relaxed without substantially jeopardizing the optical performance of the resulting projection objective.

In the embodiment, one of the merit function components used in the computational process defines a desired maximum irradiance property which involves that the maximum value for the effective irradiance $IRRDD_{EFF}$ occurring on each optical surface (except for the last optical surface closest to the image surface) does not exceed a predetermined irradiance threshold value IRRTV.

Figure 3:
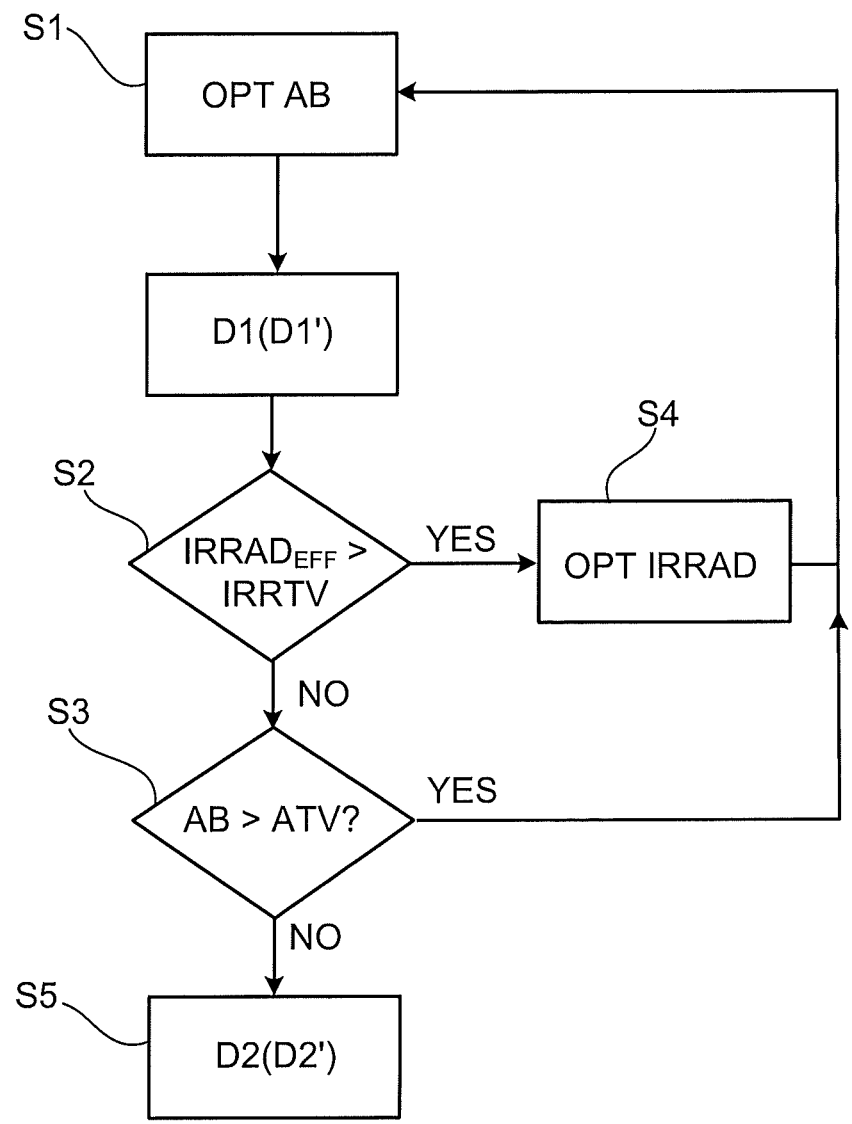
FIG. 3 shows a schematic flow chart illustrating a manufacturing method to avoid optical surfaces having relatively importantly large concentrations of irradiance.

As used here, the term "irradiance" describes the power of electromagnetic radiation at a surface, per unit area. Specifically, the term "irradiance" describes the power of electromagnetic radiation incident on the surface. The SI units for irradiance is Watts per square meter ($W/m^2$). The irradiance is sometimes also called intensity, but may not be confused with a radiant intensity, which has different units. The term "effective irradiance" (also denoted as "pin-hole irradiance") describes the contribution to an overall irradiance incident on an optical surface, which originates from radiation emerging from one single object field point. In terms of ray propagation, the "effective irradiance" corresponds to a "geometrical ray density" of different rays originating from a common field point at equidistant aperture steps. The effective irradiance may be homogeneous on a surface. In general, the effective irradiance may vary across a surface to define a region of maximum effective irradiation (corresponding to large local geometrical ray density) and regions of smaller values for effective irradiation (corresponding to smaller geometrical ray densities).

Where relatively large values of effective irradiance occur on an optical surface, those optical surfaces may be important with respect to surface imperfections, such as scratches and contamination. Relatively large values of effective irradiance may be caused, for example, by caustic conditions on optical surfaces and/or by relatively importantly small effective sub-apertures on optical surfaces Embodiments of an optimization routine implemented into a software program used to calculate an optical design (layout) of projection objective is now explained in context with the schematic flow chart shown in FIG. 3. In a first step S1 (Optimization with regard to aberrations, OPT AB) a basic layout of an optical design is optimized with respect to aberrations to obtain an optimized design D1. To this end, conventional subroutines of a suitable optical design program may be used to vary one or more structural parameters of the projection objective and to calculate the resulting overall aberrations of the designs. The resulting optimized design D1 may or may not have optical surfaces where large concentrations of effective irradiance occur locally on one or more optical surfaces.

In a second step S2 the optimized design is analysed to determine whether or not a normalized effective irradiance value $IRRAD_{EFF}$ representing an effective irradiance normalized to an effective irradiance in an image surface of the projection objective exceeds a predefined irradiance threshold value IRRTV on each optical surface of the projection objective (except for the last optical surface directly adjacent to the image surface of the projection objective).

If the normalized effective irradiance value $IRRAD_{EFF}$ does not exceed the irradiance threshold value IRRTV on any optical surface (with a possible exception for the last optical surface), then the parameters describing the optimized design D1 are input into an aberration determination step S3 to determine whether or not the aberration level AB lies above or below a predefined aberration threshold value ATV. If the aberration level is below the aberration threshold value, then an optimized design D2 is output as a result of the optimization procedure. Final design D2 may be identical to optimized design D1 which served as an input for the irradiance determination in step S2.

If the irradiance determination in step S2 determines that the normalized effective irradiance value IRRAD of optimized design D1 exceeds the irradiation threshold value IRRTV for at least one optical surface (except for the last optical surface), then the calculation routine proceeds to irradiance optimization step S4 (OPT IRRAD), where the optimized design D1 is reoptimized with regard to effective irradiance to reduce local concentrations of irradiance on relatively important optical surfaces. To this end, at least one structural parameter of the projection objective is varied and an overall merit function including the merit function component defining the desired maximum irradiance property are employed. The resulting reoptimized design D1' is then input via step S1 into the irradiance determination step S2 to determine whether or not the normalized irradiance value is now below the irradiance threshold value IRRTV for each of the considered optical surfaces. An iteration including two or more reoptimization steps may be used for that purpose.

If the irradiance determining step S2 determines that the resulting reoptimized design D1' is optimized with regard to the occurrence of local maxima of irradiance, then the optimized structure is input into the aberration determination step S3 to determine whether the reoptimization with regard to irradiance has caused one or more relatively important aberrations to lay above a respective aberration threshold value. If the reoptimized design is still acceptable with regard to aberrations, a final design D2' is obtained and output in step S5.

If the design needs to be optimized with regard to aberrations, the structural parameters received from step S2 are input into step S1 to modify the optical design (which has already been optimized with regard to irradiance) also with regard to aberrations. One or more iterations may be involved to reoptimize the design with regard to aberration and still obtain normalized irradiance value below a particular irradiance threshold value IRRTV for all relatively important optical surfaces. A final design D2' is the result of the reoptimization procedure.

In some embodiments the subroutine for the irradiance determining determination step S2 allows to avoid the occurrence of caustic conditions on all optical surfaces and/or to avoid relatively importantly small sub-apertures on all optical surfaces except for the last optical surface closest to the image surface.

In certain embodiments of a computational routine designed to systematically avoid the occurrence of caustic condition on optical surfaces is now explained in connection with FIG. 4 to 6.

In a first step of the computational part of the manufacturing method a number of representative field points is defined. Ray tracing is performed for rays of ray bundles originating from those representative field points.

In a second step a pupil raster is defined, where the pupil raster represents an array of raster points in a pupil surface of the projection objective, where the raster points are spaced apart from each other in a two-dimensional array at pre-defined distances.

In a third step, ray trajectories of rays originating from the representative field points and passing through the raster points of the pupil raster are calculated for each of the representative field points. For that purpose, commercially available design programs such as CODE V, OSLO or ZEMAX may be used.

The pupil raster typically encompasses the entire utilized aperture of the projection objective, where the aperture determines the opening angle of ray bundles originating from each representative field point. In a pupil raster schematically illustrated in FIG. 4, the coordinates of the raster points in the pupil surface are given in polar coordinates such that neighbouring raster points (i.e. raster points immediately adjacent to each other with a predefined distance there between) have the same distance in an azimuthal direction. In such embodiments, an angular step width between neighbouring raster points in the circumferential (azimuthal) direction is 10/3 degrees. The coordinates of raster points in the radial direction (radial coordinate) correspond to aperture angles included between the respective rays and the optical axis. The angles are also denoted as "pupil angle" in this application. The absolute value of the sine of the pupil angle is stepwise increased according to a square-root function between angle θ and a maximum angle and $k_{max}=NA \cdot \beta$ according to $k_i = \sqrt{i/n} k_{max}$, where i=0, 1, ..., n, NA is the image-side numerical aperture of the projection objective, and β is the magnification factor between object field and image field. By doing so, the pupil surface is subdivided into raster fields (or raster cells) having substantially the same raster field area.

In a fourth step intersection points of the selected rays with the optical surfaces within the projection objective are calculated for each optical surface (potentially excluding the last optical surface immediately adjacent to the image surface in some cases).

In the subsequent steps pairs of directly neighbouring raster points in the pupil surface are considered. Directly neighbouring raster points are characterized in that both raster points of the pair have either the same azimuthal coordinate or the same pupil angle coordinate, while the respective other coordinates differ by one coordinate step in the respective coordinate direction according to a preselected step width. For each pair of neighbouring raster points, the difference quotient $$g_{ij}^f = \frac{|x_i^f - x_j^f|}{|k_i - k_j|} \quad (1)$$

is calculated, where f represents the number of the respective optical surface, and I, j represent the indices of neighbouring pupil raster points. In equation (1), variables x and k are vectors. The components of vector x represent coordinates of a point an optical surface in real space. The components of vector k are direction sine values representing the x, y and z coordinates of a unit vector pointing in the propagation direction of a ray in the entrance pupil of the optical system (i.e. in pupil space). Therefore, the difference quotient in (1) is a measure indicating the relation between a step with predefined step width in pupil space (variable k) and a corresponding step width in real space on the optical surface (variable x). With other words: the gradient parameter $g_{ij}^f$ defined by the difference quotient of equation (1) describes the degree of change of intersection points on a respective surface for a given difference in pupil coordinates. (The difference quotient of equation (1) is an approximation of a differential quotient indicating that a finite step widths is typically used in the numerical calculation. The difference quotient of equation (1) becomes a differential quotient as the step width approaches zero).

Note that the numerical criterion given in equation (1) above is defined using a linear gradient. More precisely, the ratio between areas of one grid mesh element on the surface corresponding to a related one in directional space could be controlled. Practically it shows, however, that controlling the linear gradient in nearly orthogonal directions is sufficient in most cases to avoid local peaks of ray density.

In a further step, a gradient threshold value is defined, which represents a minimum acceptable gradient between neighbouring intersection points on the optical surfaces. For example, a gradient threshold value $g_{ij}^f$(min)=10 mm may be defined.

Figure 4:
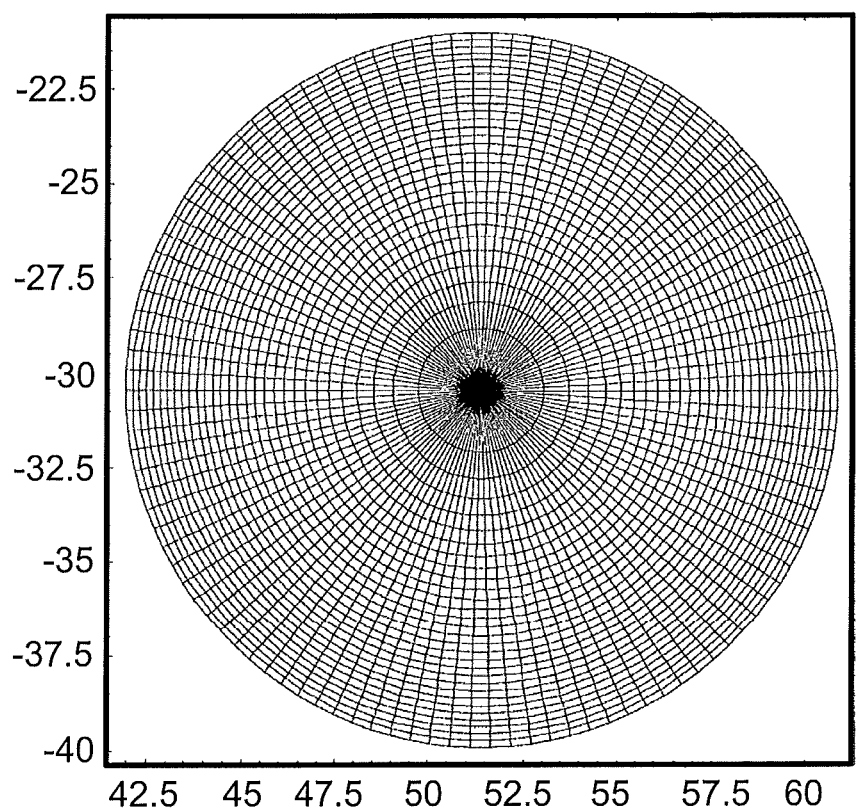
FIG. 4 shows a pupil raster of pupil points to divide a pupil surface into raster fields having substantially the same raster field area.
Figure 5:
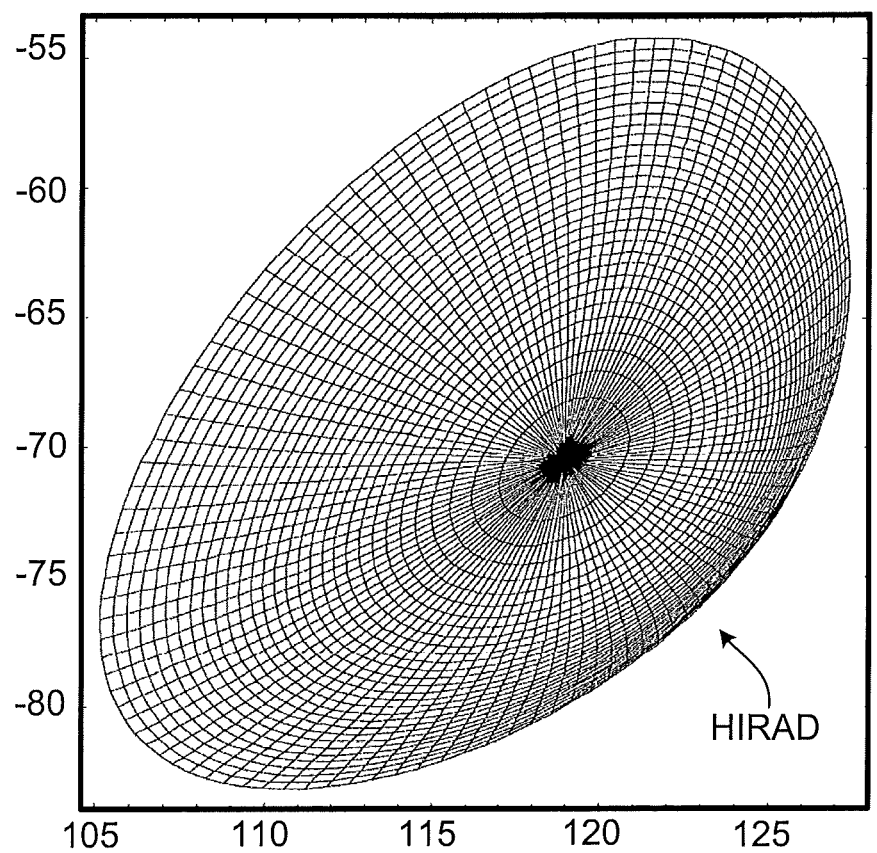
FIG. 5 shows intersection points of rays of the pupil raster shown in FIG. 4 on a selected optical surface distant from the pupil surface, where a region of relatively high effective irradiance (or pin-hole irradiance) is illustrated.

As a further illustration of the meaning of the gradient parameter FIG. 5 shows the intersection points of rays of the pupil raster shown in FIG. 4 on a selected optical surface f for a selected representative field point. It is evident, that the distribution of intersection points, and as a consequence, the distribution of irradiance across the optical surface, is not uniform since the local density of intersection points is significantly larger in a high irradiance region HIRAD at the lower right part of the optical surface than in other parts of the optical surface such as in the upper left part diametrically opposed to the high irradiance region. However, no caustic conditions are given on the optical surface since the sequence of intersection points in azimuthal and radial direction is the same as in the pupil surface (although the step width between neighbouring intersection points indicative of the amount of a irradiance in the respective area varies significantly across the optical surface.) The situation shown in FIG. 5 corresponds to value of 4.7 mm for the gradient parameter $g_{ij}^f$.

In a next step, the minimum value of the gradient parameter is calculated for each of the optical surfaces (optionally except for the last optical surface). If the minimum value calculated for a specific optical surface is found to be smaller than the gradient threshold value, then the structural parameters of the projection objective are optimized such that the minimum gradient on the respective optical surface increases until its value is equal to or larger than the gradient threshold value. For example, the optimization procedure may include increasing the distance between the respective optical surface and a neighbouring field surface (such as the object surface, an intermediate image or the image surface). Alternatively, or in addition, the local inclination of the optical surface in the region of minimum gradient may be changed to increase the gradient calculated for neighbouring intersection points.

A corresponding radius $R_{SUBEFF}$ of an "effective sub-aperture" can be calculated according to:

$$R_{SUBEFF} = \text{Min}(g_{ij}^f) \cdot NA_{OBJ}, \quad (2)$$

where $\text{Min}(g_{ij}^f)$ is the minimum value of the difference quotient in equation (1) and $NA_{OBJ}$ is the image side numerical aperture. Note that a region with minimum value for the gradient parameter corresponds to a region with maximum geometrical ray density (and maximum effective irradiance).

As a final result of the optimization procedure, all optical surfaces of the projection objective are positioned and shaped such that the gradient parameter is equal to or larger than the gradient threshold value. In terms of irradiance this desired property corresponds to the condition that a normalized irradiance value IRRAD representing an irradiance normalized to an irradiance in an image surface of the projection objective does not exceed a predefined irradiance threshold value IRRTV on each optical surface of the projection objective (except for the last optical surface directly adjacent to the image surface of the projection objective). Where the irradiance does not exceed an acceptable maximum value for the normalized irradiance, the optical performance of the projection objective becomes relatively insensitive to potential imperfections on the optical surfaces, as described above.

Figure 6:
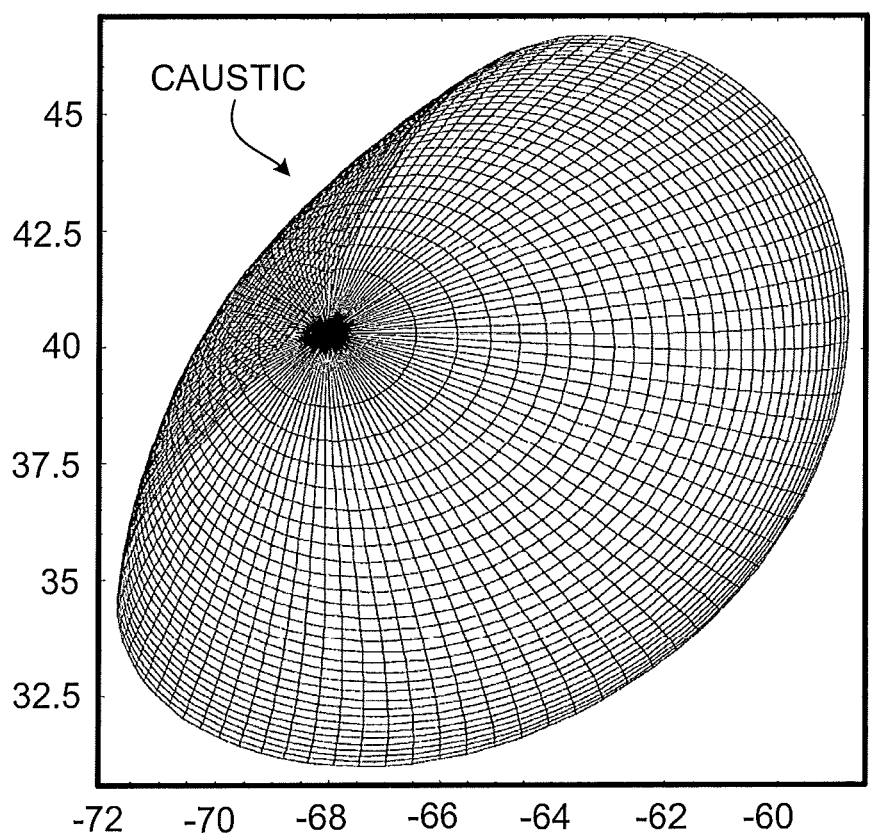
FIG. 6 shows intersection points of rays of the pupil raster shown in FIG. 4 on a selected optical surface distant from the pupil surface, where a region with caustic condition is illustrated.

For comparison, FIG. 6 shows the intersection points of rays of the pupil raster on a "virtual" system surface within a region where caustic conditions occur for a field point. In the upper left part of the virtual surface it is evident that the intersection points corresponding to pupil coordinates at the outer edge of the pupil lie closer to the intersection point of the axial ray than intersection points corresponding to raster points positioned somewhere between the optical axis and the outer edge of the pupil. With other words, rays originating from a certain field point at different numerical aperture (represented by different radial coordinates in the pupil raster) intersect on the respective optical surface or in the vicinity thereof such that a ray corresponding to a larger aperture value in the pupil surface intersects with the optical surface closer to the axial ray than rays corresponding to smaller aperture values. In this representation, the gradient parameter $g_{ij}^f$ attains its minimum value 0 mm in the region of the optical surface which lies in a caustic region CAUSTIC (upper left part).

Employing this method systematically leads to optical designs where none of the optical surfaces is positioned in a caustic region and/or in a region with very small effective sub-apertures. Where such optical surfaces are avoided in an optical system, specifications with regard to surface quality and/or contamination may be relaxed, thereby facilitating manufacturing of an optical system.

Figure 7:
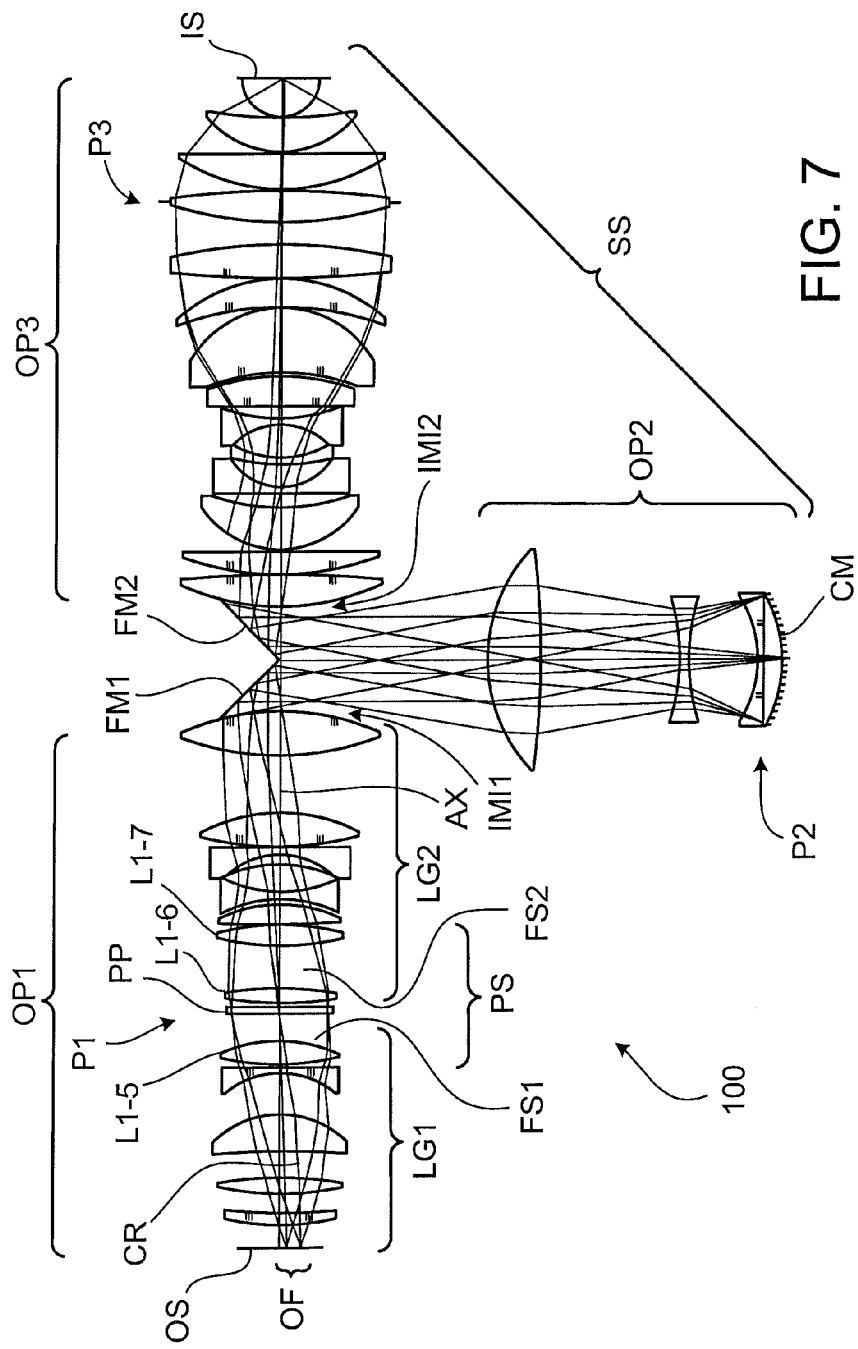
FIG. 7 shows a catadioptric projection objective having two intermediate images, one concave mirror and two planar deflecting mirrors, where caustic conditions are systematically avoided on optical surfaces close to the intermediate images.

FIG. 7 shows a catadioptric projection objective 100 observing those conditions. The projection objective is designed for a nominal UV-operating wavelength λ=193 nm. The specification is given in tables 1, 1A. Projection objective 100 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis AX. A first refractive objective part OP1 is designed for imaging the pattern in the object surface into the first intermediate image IMI1 at an enlarged scale. A second, catadioptric (refractive/reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

The path of the chief ray CR of an outer field point of the off-axis object field OF is drawn bold in FIG. 7 in order to facilitate following the beam path of the projection beam. For the purpose of this application, the term "chief ray" (also known as principal ray) denotes a ray running from an outermost field point (farthest away from the optical axis) of the effectively used object field OF to the center of the entrance pupil. Due to the rotational symmetry of the system the chief ray may be chosen from an equivalent field point in the meridional plane as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective object field is used. The chief ray and marginal ray are chosen to characterize optical properties of the projection objectives. The angles included between such selected rays and the optical axis at a given axial position are denoted as "chief ray angle" (CRA) and "marginal ray angle" (MRA), respectively. The radial distance between such selected rays and the optical axis at a given axial position are denoted as "chief ray height" (CRH) and "marginal ray height" (MRH), respectively.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a single concave mirror CM. A first planar folding mirror FM1 is arranged optically close to the first intermediate image IMI1 at an angle of 45° to the optical axis AX such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM in the direction of the image surface, which is parallel to the object surface.

The folding mirrors FM1, FM2 are each located in the optical vicinity of an intermediate image, so that the etendue (geometrical flux) is kept small. The intermediate images are optionally not located on the planar mirror surfaces, which results in a finite minimum distance between the intermediate image and the optically closest mirror surface. This is to ensure that any faults in the mirror surface, such as scratches or impurities, are not imaged sharply onto the image surface.

The first objective part OP1 includes two lens groups LG1, LG2 each with positive refractive power on either side of the first pupil surface P1. First lens group LG1 is designed to image the telecentric entrance pupil of the projection objective into the first pupil surface P1, thereby acting in the manner of a Fourier lens group performing a single Fourier transformation.

This Fourier transformation leads to a relatively small maximum chief ray angle $CRA_{P1}$ in the order of 17° at the first pupil surface. As a consequence, according to the Lagrange invariant, the optically free diameter of the first pupil is relatively large, indicated by a diameter $D_1$=145 mm of the radiation beam in the first pupil surface.

The relatively small chief ray angle along with the large pupil diameter corresponds to a relatively large axial extension of a pupil space PS. For the purpose of this application the pupil space is defined as a region where the marginal ray height MRH is substantially greater than the chief ray height CRH such that the condition RHR<B<<1 is fulfilled for the ray height ratio RHR=CRH/MRH. The upper limit B of the ray height ratio may be smaller than 0.4 or smaller than 0.3 or smaller than 0.2, for example. If this condition is fulfilled, a correction applied in the pupil space will have an essentially field-constant effect. The axial extension of the pupil space is increased as the chief ray angle at the respective pupil is reduced. In such embodiments, the condition RHR<0.3 is fulfilled.

In such embodiments, the pupil space PS includes the first lens L1-6 of LG2 immediately downstream of the pupil surface (biconvex lens) and extends up to the subsequent lens L1-7 on the image-side of the pupil surface and up to the biconvex positive lens L1-5 immediately upstream of the first pupil surface. Free spaces FS1 (=41 mm) and FS2 (=62 mm), each having an axial extension of at least 40 mm allowing to place one or more thin correcting elements into the free space are formed on either side of the pupil surface P1 within the pupil space PS, i.e. optically close to the pupil surface. Therefore, such embodiments allow introducing one or more correcting elements optically close to the first pupil surface P1 in order to obtain correcting effects which are essentially the same for all field points of the field (field-constant correction).

A parallel plate PP is positioned in the pupil space PS at the first pupil surface P1 where the condition RHR≈0 is fulfilled. The parallel plate is part of the original design of the projection objective and may serve as a placeholder for a correcting element which may also be formed essentially as a plane parallel plate having the same thickness and material, where at least one surface has an aspheric shape.

As mentioned above, in high-aperture projection objectives typically used in microlithography relatively small real and/or effective sub-apertures of ray bundles may occur at certain optical surfaces, for example optical surfaces close to a field surface. For example, in FIG. 7, the first folding mirror FM1 and the second folding mirror FM2 are both positioned optically close to a neighboring intermediate image IMI1 and IMI2, respectively such that relatively small real sub-apertures occur on those folding mirrors. In general, the irradiance on an optical surface increases as the size of sub-apertures decreases. Where relatively large values of irradiance occur on an optical surface, those optical surfaces may be relatively important with respect to surface imperfections, such as scratches and contamination. Also, caustic conditions may occur on certain optical surfaces within the optical system, particularly close to field surfaces. Where an optical surface lies in a caustic region, the irradiance may become divergent.

Due to these effects the specifications with regard to surface quality and contamination is desirably kept particularly severe in optical systems having optical surfaces in regions of small sub-apertures and/or in regions where caustic conditions occur. On the other hand, if such surfaces are avoided in an optical system, specifications with regard to surface quality and/or contamination may be relaxed, thereby facilitating manufacturing of an optical system.

Figure 8:
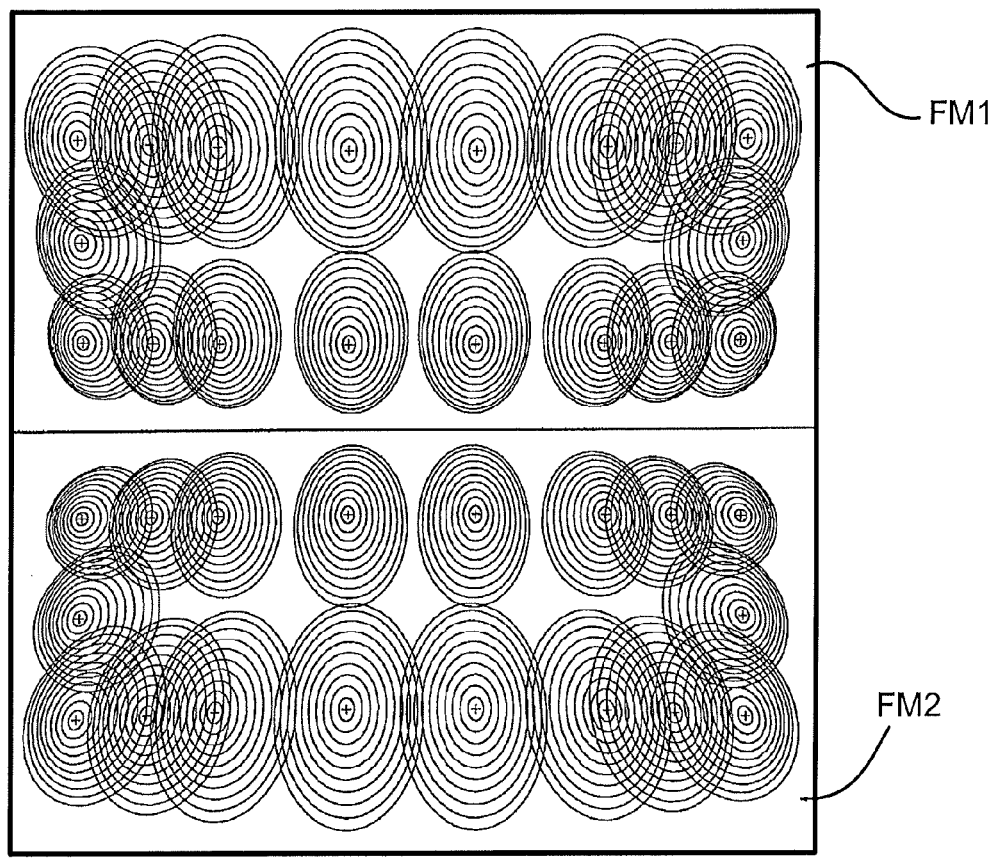
FIG. 8 shows footprints of selected field points around the edge of a rectangular field on the first and second folding mirrors of FIG. 7.

In the manufacture of the embodiment of FIG. 7, particular emphasis was placed on the correction of the ray paths such that the first and second folding mirrors FM1, FM2 are placed well apart from the intermediate images to obtain relatively large sub-apertures and also with respect of control of caustic conditions such that no caustic condition occurs on either of the folding mirrors FM1 and FM2. This is demonstrated qualitatively in FIG. 8, which shows footprints of 18 selected field points around the edge of a rectangular field on the first folding mirror FM1 and the second folding mirror FM2. In each footprint, ray bundles are shown in 10 equidistant aperture steps. It is evident that the substantially elliptic lines corresponding to different aperture ray bundles originating from the same field point do not intersect, but are interleaved without intersection of the folding mirrors. This indicates that both the first and the second folding mirror are in regions without caustic conditions, i.e. in "caustic-free" regions. Also, the biconvex positive lens arranged in a double-path region geometrically between the folding mirrors FM1, FM2 and the concave mirror and optically relatively close to the first and second intermediate images is in a caustic-free region. As a consequence, the embodiment of FIG. 7 is relatively tolerant with regard to surface imperfections and/or contamination on the optical surfaces close to the intermediate images IMI1, IM12.

The above description of certain embodiments has been given by way of example. The individual features may be implemented either alone or in combination as embodiments of the disclosure, or may be implemented in other fields of application. Further, they may represent advantageous embodiments that are protectable in their own right, for which protection is claimed in the application as filed or for which protection will be claimed during pendency of the application. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

The contents of all the claims is made part of this description by reference.

TABLE 1

NA = 1.36; λ = 193 nm; image field height y' = 15.3 mm

| SURF | RADIUS | THICKNESS | MATERIAL | INDEX | SEMIDIAM. |
|---|---|---|---|---|---|
| 0 | 0.000000 | 35.011188 | | | 61.0 |
| 1 | 382.185274 | 19.022510 | SILUV | 1.560491 | 76.3 |
| 2 | 3355.596936 | 28.816162 | | | 78.2 |
| 3 | 477.218860 | 22.631304 | SILUV | 1.560491 | 88.5 |
| 4 | −922.196146 | 38.663099 | | | 89.6 |
| 5 | −1118.102672 | 50.000005 | SILUV | 1.560491 | 94.1 |
| 6 | −166.502079 | 68.193522 | | | 96.5 |
| 7 | −129.699842 | 10.289512 | SILUV | 1.560491 | 77.3 |
| 8 | −568.486045 | 1.404508 | | | 81.1 |
| 9 | 360.871595 | 36.412765 | SILUV | 1.560491 | 83.7 |
| 10 | −221.344939 | 41.316186 | | | 84.0 |
| 11 | 0.000000 | 10.000000 | SILUV | 1.560491 | 72.7 |
| 12 | 0.000000 | 4.999963 | | | 74.5 |
| 13 | 558.300871 | 22.827559 | SILUV | 1.560491 | 78.0 |
| 14 | −433.013634 | 62.173564 | | | 79.5 |
| 15 | 441.363089 | 31.099429 | SILUV | 1.560491 | 89.5 |
| 16 | −341.473462 | 1.170281 | | | 89.5 |
| 17 | 1222.280168 | 28.519264 | SILUV | 1.560491 | 87.1 |
| 18 | −247.039506 | 8.650761 | | | 85.9 |
| 19 | −185.932756 | 10.099134 | SILUV | 1.560491 | 84.0 |
| 20 | 182.286218 | 55.304594 | | | 81.0 |
| 21 | −119.613521 | 10.814913 | SILUV | 1.560491 | 81.8 |
| 22 | 4853.350949 | 2.068171 | | | 100.7 |
| 23 | 496.760047 | 50.132029 | SILUV | 1.560491 | 111.1 |
| 24 | −245.672304 | 88.351331 | | | 114.4 |
| 25 | 444.836588 | 64.064520 | SILUV | 1.560491 | 145.2 |
| 26 | −295.503989 | 76.306203 | | | 145.2 |
| 27 | 0.000000 | −314.280203 | REFL | | 132.8 |

TABLE 1-continued

NA = 1.36; λ = 193 nm; image field height y' = 15.3 mm

| SURF | RADIUS | THICKNESS | MATERIAL | INDEX | SEMIDIAM. |
|---|---|---|---|---|---|
| 28 | −247.137511 | −77.271453 | SILUV | 1.560491 | 160.0 |
| 29 | 810.350730 | −208.473351 | | | 158.0 |
| 30 | 294.775031 | −12.500000 | SILUV | 1.560491 | 88.1 |
| 31 | −286.941223 | −102.432781 | | | 84.7 |
| 32 | 180.414660 | −12.500000 | SILUV | 1.560491 | 87.2 |
| 33 | 10035.763024 | −26.892770 | | | 94.5 |
| 34 | 194.482349 | 26.892770 | REFL | | 96.0 |
| 35 | 10035.763024 | 12.500000 | SILUV | 1.560491 | 94.5 |
| 36 | 180.414660 | 102.432781 | | | 87.2 |
| 37 | −286.941223 | 12.500000 | SILUV | 1.560491 | 84.7 |
| 38 | 294.775031 | 208.473351 | | | 88.1 |
| 39 | 810.350730 | 77.271453 | SILUV | 1.560491 | 158.0 |
| 40 | −247.137511 | 314.280047 | | | 160.0 |
| 41 | 0.000000 | −78.000672 | REFL | | 133.2 |
| 42 | −339.895111 | −48.598415 | SILUV | 1.560491 | 146.4 |
| 43 | 1373.456750 | −0.999276 | | | 145.7 |
| 44 | −504.213001 | −36.238195 | SILUV | 1.560491 | 142.0 |
| 45 | 5356.202306 | −0.999341 | | | 139.7 |
| 46 | −140.155457 | −64.600486 | SILUV | 1.560491 | 114.8 |
| 47 | −334.057880 | −20.315663 | | | 100.9 |
| 48 | 6443.720921 | −9.999173 | SILUV | 1.560491 | 96.9 |
| 49 | −92.325569 | −33.314435 | | | 73.6 |
| 50 | −368.587379 | −9.998836 | SILUV | 1.560491 | 73.0 |
| 51 | −149.804097 | −48.568442 | | | 69.7 |
| 52 | 102.768893 | −9.999251 | SILUV | 1.560491 | 69.8 |
| 53 | −268.102298 | −17.334160 | | | 86.4 |
| 54 | −894.642180 | −45.003218 | SILUV | 1.560491 | 91.1 |
| 55 | 341.239295 | −3.399868 | | | 107.0 |
| 56 | 555.007734 | −98.611795 | SILUV | 1.560491 | 110.1 |
| 57 | 161.562349 | −0.999537 | | | 135.5 |
| 58 | 1424.973978 | −41.439862 | SILUV | 1.560491 | 148.9 |
| 59 | 240.839763 | −0.999688 | | | 152.2 |
| 60 | −861.203459 | −50.810112 | SILUV | 1.560491 | 158.2 |
| 61 | 771.781511 | −33.917678 | | | 160.0 |
| 62 | −546.418872 | −47.441425 | SILUV | 1.560491 | 160.0 |
| 63 | 1544.671665 | 18.607639 | | | 159.4 |
| 64 | 0.000000 | −19.607228 | | | 160.7 |
| 65 | −280.711459 | −56.538959 | SILUV | 1.560491 | 148.9 |
| 66 | −2833.791703 | −0.998656 | | | 145.5 |
| 67 | −151.439302 | −51.205187 | SILUV | 1.560491 | 109.5 |
| 68 | −2634.011137 | −1.000000 | | | 101.4 |
| 69 | −60.618256 | −52.074212 | SILUV | 1.560491 | 54.6 |
| 70 | 0.000000 | −3.000000 | H2OV193 | 1.436823 | 23.6 |
| 71 | 0.000000 | 0.000000 | | | 15.3 |

TABLE 1A

ASPHERIC CONSTANTS

| | SRF | | | | |
|---|---|---|---|---|---|
| | 2 | 8 | 23 | 26 | 29 |
| K | 0 | 0 | 0 | 0 | 0 |
| C1 | 1.347468E−08 | 6.034781E−08 | −1.016331E−08 | 1.654839E−08 | −1.366914E−08 |
| C2 | 2.207912E−12 | 1.030721E−12 | 2.248738E−13 | 9.975098E−13 | 1.191027E−13 |
| C3 | 9.965819E−17 | 4.363266E−16 | −6.682385E−17 | −2.875416E−19 | −1.501877E−18 |
| C4 | 3.306256E−20 | −1.299667E−19 | 2.186818E−21 | −1.140427E−23 | 3.212707E−23 |
| C5 | −6.720858E−24 | 1.514107E−23 | −2.369614E−26 | −9.698834E−29 | −7.689882E−28 |
| C6 | 5.149578E−28 | −7.081928E−28 | −3.385824E−31 | 7.791686E−33 | 9.534303E−33 |

| | SRF | | | | |
|---|---|---|---|---|---|
| | 33 | 35 | 39 | 43 | 44 |
| K | 0 | 0 | 0 | 0 | 0 |
| C1 | 3.177312E−08 | 3.177312E−08 | −1.366914E−08 | −2.403138E−09 | −4.337241E−09 |
| C2 | −1.077719E−12 | −1.077719E−12 | 1.191027E−13 | −9.726816E−14 | −1.770230E−13 |
| C3 | 5.276309E−17 | 5.276309E−17 | −1.501877E−18 | −3.883610E−18 | −6.575209E−18 |
| C4 | −2.529805E−21 | −2.529805E−21 | 3.212707E−23 | 1.766230E−22 | 7.684192E−23 |
| C5 | 1.307247E−25 | 1.307247E−25 | −7.689882E−28 | −3.969746E−27 | −8.791789E−28 |
| C6 | −7.341513E−30 | −7.341513E−30 | 9.534303E−33 | 6.671253E−32 | 6.418850E−32 |

TABLE 1A-continued

ASPHERIC CONSTANTS

| | SRF | | | | |
|---|---|---|---|---|---|
| | 54 | 56 | 58 | 60 | 63 |
| K | 0 | 0 | 0 | 0 | 0 |
| C1 | 3.845765E−08 | 5.917411E−08 | 3.947900E−08 | −1.247993E−10 | 1.795292E−08 |
| C2 | 3.149540E−12 | −1.711396E−12 | −1.804073E−13 | −1.251219E−13 | −1.289060E−12 |
| C3 | −1.246913E−16 | −3.877057E−17 | −3.154989E−17 | 2.971143E−17 | 5.175936E−17 |
| C4 | 6.730427E−21 | −6.143291E−22 | 2.071680E−21 | −8.028081E−22 | −1.070499E−21 |
| C5 | −1.009901E−24 | 5.363788E−25 | −8.838538E−26 | 2.050122E−26 | 1.388166E−26 |
| C6 | −3.983455E−29 | −2.016608E−29 | 1.721616E−30 | −3.004535E−31 | −1.098382E−31 |

| | SRF | |
|---|---|---|
| | 66 | 68 |
| K | 0 | 0 |
| C1 | 2.376124E−08 | −2.061112E−08 |
| C2 | −4.937362E−13 | −2.944479E−12 |
| C3 | 2.984424E−17 | 2.901078E−16 |
| C4 | −1.965712E−21 | −2.145724E−20 |
| C5 | 5.583512E−26 | 1.078059E−24 |
| C6 | −5.689719E−31 | −3.014279E−29 |

What is claimed is:

1. A method, comprising:
computing a numerical value for each of a plurality of merit function components based on a corresponding feature of a preliminary design of a projection objective, wherein each of the plurality of merit function components corresponds to a respective quality parameter;
computing from the merit function components an overall merit function expressible in numerical terms that reflect corresponding quality parameters;
successively varying at least one structural parameter of the design of the projection objective and recomputing a resulting overall merit function value with each successive variation until the resulting overall merit function reaches a predetermined acceptable value at an optimized design of the projection objective; and
obtaining the structural parameters of the optimized design of the projection objective having the predetermined acceptable value for the resulting overall merit function, further comprising:
defining a number of representative field points;
defining a pupil raster representing an array of mutually spaced apart raster points in a pupil surface of the projection objective;
calculating, for each of the representative field points, ray trajectories of rays of the projection objective originating from the representative field points and passing through the raster points of the pupil raster;
calculating, for each optical surface of a plurality of optical surfaces of the projection objective, intersection points of the rays with the optical surface;
calculating for each optical surface a plurality of gradient parameters representing respective gradients between intersection points corresponding to neighbouring raster points arranged directly adjacent to each other;
defining a gradient threshold value representing a minimum acceptable gradient between neighbouring intersection points; and
optimizing at least one of the structural parameters of the design of the projection objective such that the gradient parameter does not fall below the gradient threshold value for each optical surface of the projection objective except for an optical surface that is a last optical surface of the plurality of optical surfaces in a direction of ray propagation through the projection objective.

2. The method of claim 1, further comprising using the structural parameters of the optimized design of the projection objective to make the projection objective.

3. A method according to claim 1, further comprising:
calculating a position and an extent of potential caustic regions within the projection objective; and
optimizing the structural parameters of the design of the projection objective such that no optical surface is positioned inside a caustic region.

4. A method according to claim 1, wherein the pupil raster is defined such that the pupil surface is subdivided into raster fields having substantially the same raster field area.

5. A method according to claim 1, wherein the pupil raster is defined in polar coordinates such that neighbouring raster points have the same distance in an azimuthal direction and a pupil angle k varies in steps between 0 and $k_{max}=NA\cdot\beta$ according to $k_i=\sqrt{i/n}k_{max}$, where i=0, 1, . . . , n, NA is the image-side numerical aperture of the projection objective, and $\beta$ is the magnification factor between object field and image field.

6. The method according to claim 1, wherein the projection objective is a catadioptric projection objective designed to image an off-axis object field arranged in an object surface into an off-axis image field arranged in an image surface, the projection objective comprising:
at least one concave mirror;
at least one intermediate image; and
at least one folding mirror arranged to deflect radiation coming from an object surface towards the concave mirror or arranged to deflect radiation coming from the concave mirror towards the image surface.

7. The method according to claim 6, wherein the optical elements form:
a first refractive objective part generating a first intermediate image from radiation coming from the object surface and including a first pupil surface;

a second objective part including the at least one concave mirror imaging the first intermediate image into a second intermediate image and including a second pupil surface optically conjugated to the first pupil surface; and a third refractive objective part imaging the second intermediate image onto the image surface and including a third pupil surface optically conjugated to the first and second pupil surfaces.

8. The method according to claim 7, wherein the projection objective has exactly two intermediate images and/or wherein the second objective part has exactly one concave mirror and the projection objective has a first folding mirror to deflect radiation coming from the object surface in the direction of the concave mirror, and a second folding mirror to deflect radiation coming from the concave mirror in the direction of the image surface and/or wherein the projection objective is designed for immersion lithography at NA>1.

9. The method of claim 1, wherein the projection objective is designed to be used in microlithography.

10. A method, comprising:
computing a numerical value for each of a plurality of merit function components based on a corresponding feature of a preliminary design of a projection objective, wherein each of the plurality of merit function components corresponds to a respective quality parameter;
computing from the merit function components an overall merit function expressible in numerical terms that reflect corresponding quality parameters;
successively varying at least one structural parameter of the design of the projection objective and recomputing a resulting overall merit function value with each successive variation until the resulting overall merit function reaches a predetermined acceptable value at an optimized design of the projection objective; and
obtaining the structural parameters of the optimized design of the projection objective having the predetermined acceptable value for the resulting overall merit function,
further comprising:
defining a number of representative field points;
calculating ray bundles originating from the field points and intersection zones of the ray bundles with a plurality of optical surfaces of the projection objective, where an intersection zone of a ray bundle with an optical surface of the plurality of optical surfaces defines a real sub-aperture having a real sub-aperture size defined by the area of the intersection zone;
defining a sub-aperture size threshold value; and
optimizing the structure parameters of the projection objective such that the real sub-aperture size for selected field points does not fall below the sub-aperture size threshold value for all optical surfaces of the projection objective except for a last optical surface of the plurality of optical surfaces directly adjacent to an image surface of the projection objective.

11. The method of claim 10, further comprising using the structural parameters of the optimized design of the projection objective to make the projection objective.

12. The method of claim 10, further comprising:
calculating a position and an extent of potential caustic regions within the projection objective; and
optimizing the structural parameters of the design of the projection objective such that no optical surface is positioned inside a caustic region.

13. The method of claim 10, wherein the projection objective is a catadioptric projection objective designed to image an off-axis object field arranged in an object surface into an off-axis image field arranged in an image surface, the projection objective comprising:
at least one concave mirror;
at least one intermediate image; and
at least one folding mirror arranged to deflect radiation coming from an object surface towards the concave mirror or arranged to deflect radiation coming from the concave mirror towards the image surface.

14. The method of claim 13, wherein the optical elements form:
a first refractive objective part generating a first intermediate image from radiation coming from the object surface and including a first pupil surface;
a second objective part including the at least one concave mirror imaging the first intermediate image into a second intermediate image and including a second pupil surface optically conjugated to the first pupil surface; and
a third refractive objective part imaging the second intermediate image onto the image surface and including a third pupil surface optically conjugated to the first and second pupil surfaces.

15. The method of claim 14, wherein the projection objective has exactly two intermediate images and/or wherein the second objective part has exactly one concave mirror and the projection objective has a first folding mirror to deflect radiation coming from the object surface in the direction of the concave mirror, and a second folding mirror to deflect radiation coming from the concave mirror in the direction of the image surface and/or wherein the projection objective is designed for immersion lithography at NA>1.

16. The method of claim 10, wherein the projection objective is designed to be used in microlithography.

17. A method, comprising:
computing a numerical value for each of a plurality of merit function components based on a corresponding feature of a preliminary design of a projection objective, wherein each of the plurality of merit function components corresponds to a respective quality parameter;
computing from the merit function components an overall merit function expressible in numerical terms that reflect corresponding quality parameters;
successively varying at least one structural parameter of the design of the projection objective and recomputing a resulting overall merit function value with each successive variation until the resulting overall merit function reaches a predetermined acceptable value at an optimized design of the projection objective; and
obtaining the structural parameters of the optimized design of the projection objective having the predetermined acceptable value for the resulting overall merit function,
wherein one of the plurality of merit function components requires that, for each optical surface of a plurality of optical surfaces of the projection objective except a last optical surface of the projection objective, an effective irradiance of the optical surface normalized to an effective irradiance in an image surface of the projection objective does not exceed a threshold value.

18. The method of claim 17, further comprising using the structural parameters of the optimized design of the projection objective to make the projection objective.

19. The method of claim 17, further comprising:
calculating a position and an extent of potential caustic regions within the projection objective; and optimizing the structural parameters of the design of the projection objective such that no optical surface is positioned inside a caustic region.

20. The method of claim 17, further comprising:
defining a number of representative field points;
defining a pupil raster representing an array of mutually spaced apart raster points in a pupil surface of the projection objective;
calculating, for each of the representative field points, ray trajectories of rays originating from the representative field points and passing through the raster points of the pupil raster;
calculating, for each optical surface, intersection points of the rays with the optical surface;
calculating for each optical surface a plurality of gradient parameters representing respective gradients between intersection points corresponding to neighbouring raster points arranged directly adjacent to each other;
defining a gradient threshold value representing a minimum acceptable gradient between neighbouring intersection points; and
optimizing structural parameters of the design of the projection objective such that the gradient parameter does not fall below the gradient threshold value for each optical surface of the projection objective except for the last optical surface.

21. The method of claim 20, wherein the pupil raster is defined such that the pupil surface is subdivided into raster fields having substantially the same raster field area.

22. The method of claim 20, wherein the pupil raster is defined in polar coordinates such that neighbouring raster points have the same distance in an azimuthal direction and a pupil angle k varies in steps between 0 and $k_{max}=NA\cdot\beta$ according to $k_i=\sqrt{i/n}k_{max}$, where i=0, 1, . . . , n, NA is the image-side numerical aperture of the projection objective, and $\beta$ is the magnification factor between object field and image field.

23. The method of claim 17, further comprising:
defining a number of representative field points;
calculating ray bundles originating from the field points and intersection zones of the ray bundles with optical surfaces, where an intersection zone of a ray bundle with an optical surface defines a real sub-aperture having a real sub-aperture size defined by the area of the intersection zone;
defining a sub-aperture size threshold value; and
optimizing the structure parameters of the design of the projection objective such that the real sub-aperture size for selected field points does not fall below the sub-aperture size threshold value for all optical surfaces of the projection objective except for a last optical surface directly adjacent to an image surface of the projection objective.

24. The method of claim 17, wherein the projection objective is a catadioptric projection objective designed to image an off-axis object field arranged in the object surface into an off-axis image field arranged in the image surface, the projection objective comprising:
at least one concave mirror;
at least one intermediate image; and
at least one folding mirror arranged to deflect radiation coming from an object surface towards the concave mirror or arranged to deflect radiation coming from the concave mirror towards the image surface.

25. The method of claim 17, wherein the projection objective is designed to be used in microlithography.

* * * * *